US012206267B2

(12) United States Patent
Tang

(10) Patent No.: US 12,206,267 B2
(45) Date of Patent: Jan. 21, 2025

(54) BATTERY PROTECTION DEVICE AND CHIP FOR PROTECTING BATTERY INCLUDING A SELECT CIRCUIT TO SELECT A VOLTAGE FOR A GATE CONTROL SIGNAL

(71) Applicant: Ming Tang, Zhubei (TW)

(72) Inventor: Ming Tang, Zhubei (TW)

( * ) Notice: Subject to any disclaimer, the term of this patent is extended or adjusted under 35 U.S.C. 154(b) by 615 days.

(21) Appl. No.: 17/400,405

(22) Filed: Aug. 12, 2021

(65) Prior Publication Data

US 2023/0045890 A1 Feb. 16, 2023

(51) Int. Cl.
*H02J 7/00* (2006.01)
*H02H 7/18* (2006.01)

(52) U.S. Cl.
CPC .......... *H02J 7/00302* (2020.01); *H02H 7/18* (2013.01); *H02J 7/0029* (2013.01); *H02J 7/00306* (2020.01); *H02J 7/0031* (2013.01); *H02J 7/0036* (2013.01)

(58) Field of Classification Search
CPC .. H02J 7/00302; H02J 7/0029; H02J 7/00306; H02J 7/0031; H02J 7/0034; H02J 7/0036; H02H 7/18
USPC .................................................. 320/134, 136
See application file for complete search history.

(56) References Cited

U.S. PATENT DOCUMENTS

| | | | | |
|---|---|---|---|---|
| 10,090,690 B2* | 10/2018 | Abe | ....................... | H02J 7/0029 |
| 2002/0018329 A1* | 2/2002 | Yoshida | ................. | H02J 7/0031 |
| | | | | 361/93.1 |
| 2009/0121682 A1* | 5/2009 | Goto | .................... | H01M 50/572 |
| | | | | 320/134 |
| 2009/0121683 A1* | 5/2009 | Goto | ...................... | H02J 7/0031 |
| | | | | 320/134 |
| 2009/0257161 A1* | 10/2009 | Liu | ........................ | H02J 7/0031 |
| | | | | 361/86 |

(Continued)

FOREIGN PATENT DOCUMENTS

| CN | 112242736 A | 1/2021 |
|---|---|---|
| CN | 112491117 A | 3/2021 |

(Continued)

OTHER PUBLICATIONS

Jhong Wun Yao, "Research on CMOS Micro Power Lithium-Ion Batteries Protection IC Design," Master thesis of Chung Yuan Christian University, Jun. 2003 (131 pp.).

*Primary Examiner* — Richard Isla
*Assistant Examiner* — Manuel Hernandez
(74) *Attorney, Agent, or Firm* — MUNCY, GEISSLER, OLDS & LOWE, P.C

(57) ABSTRACT

A chip configured to protect a battery includes a buffer circuit and a switch circuit. The buffer circuit is configured to generate a gate control signal according to a first logic control signal, a first voltage, a second voltage, and a third voltage. The switch circuit is configured to transmit the second or the third voltage to the buffer circuit. The switch circuit includes an invert circuit and a select circuit. The invert circuit is configured to invert a second logic control signal to a third logic control signal. The select circuit is configured to select the second or third voltage to transmit the same to the buffer circuit according to the second logic control signal and the third logic control signal. The gate control signal is configured to turn off a power transistor when an overcharging or an over-discharging occurs.

17 Claims, 6 Drawing Sheets

(56) References Cited

U.S. PATENT DOCUMENTS

| | | | | |
|---|---|---|---|---|
| 2012/0056592 A1* | 3/2012 | Sakurai | ................ | H02J 7/0034 |
| | | | | 320/134 |
| 2012/0069481 A1* | 3/2012 | Yamada | ................... | H02H 7/18 |
| | | | | 361/93.7 |
| 2012/0249087 A1* | 10/2012 | Kimura | .................... | H02H 7/18 |
| | | | | 320/164 |
| 2015/0084599 A1* | 3/2015 | Abe | ..................... | H02J 7/0063 |
| | | | | 320/128 |
| 2015/0231398 A1* | 8/2015 | Marnfeldt | ............. | H02J 7/0024 |
| | | | | 607/61 |
| 2016/0372954 A1* | 12/2016 | Kageyama | .......... | H02J 7/00304 |
| 2018/0013298 A1* | 1/2018 | Abe | ..................... | H03K 17/162 |
| 2018/0013299 A1* | 1/2018 | Abe | ..................... | H02J 7/0029 |

FOREIGN PATENT DOCUMENTS

| | | | | | |
|---|---|---|---|---|---|
| CN | 112583079 A | * | 3/2021 | | |
| JP | 2001352683 A | | 12/2001 | | |
| JP | 6038377 B1 | * | 12/2016 | ............ | H02J 7/0029 |
| TW | I328913 B | | 11/2007 | | |

\* cited by examiner

OC1

| Mode | SC1 | SC2 | SC3 | CDO | 200 (transistor: SD1–CG–SD2, CDO at top) |
|---|---|---|---|---|---|
| Charging mode without overcharging | digital low | digital high | Vm | CDO | VDD—[gate Vm]—VSS |
| Charging mode with overcharging | digital high | digital high | Vm | VDD | Vm—[gate Vm]—VSS |
| Disconnecting the charger | digital high | digital high | Vm | Vm | Vm—[gate Vm]—VSS |

| Mode | SC1 | SC2 | SC3 | CDO | 200 CDO—CG—SD2 / SD1 |
|---|---|---|---|---|---|
| Discharging mode without over-discharging | digital low | digital high | Vm | CDO | VDD—[gate, Vm]—VSS |
| Discharging mode with over-discharging | digital high | digital low | VDD | VDD | VDD—[gate, Vm]—VSS |
| Re-connecting the charger | digital high | digital low | VDD | VSS | VSS—[gate, Vm]—VSS |
|  |  |  |  | VSS | VSS—[gate, Vm]—VSS |

FIG. 6

BATTERY PROTECTION DEVICE AND CHIP FOR PROTECTING BATTERY INCLUDING A SELECT CIRCUIT TO SELECT A VOLTAGE FOR A GATE CONTROL SIGNAL

TECHNICAL FIELD

The present disclosure relates to a battery protection device and chip therein, and more particularly, to a battery protection device and chip therein without using diode.

DISCUSSION OF THE BACKGROUND

Conventionally, the battery is protected by operating transistors and diodes to turn off when the overcharging or an over-discharging occurs. However, the threshold voltage of the diode limits the operations of the battery protection. Therefore, preventing the problem caused by the threshold voltage of the diode becomes an important issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a chip, configured to protect a battery. The chip includes a buffer circuit and a switch circuit. The buffer circuit is configured to generate a gate control signal according to a first logic control signal, a first voltage, a second voltage, and a third voltage. The switch circuit is configured to transmit the second voltage or the third voltage to the buffer circuit. The switch circuit includes an invert circuit and a select circuit. The invert circuit is configured to invert a second logic control signal to generate a third logic control signal. The select circuit is configured to select the second voltage or the third voltage to transmit the same to the buffer circuit according to the second logic control signal and the third logic control signal. The gate control signal is configured to turn off a power transistor when an overcharging or an over-discharging occurs.

In some embodiments, the first voltage is provided by a cathode of a battery, the second voltage is provided by an anode of the battery, the third voltage is provided by an anode of a charger in a charging mode, and the third voltage is provided by an anode of a load in a discharging mode. The anode of the battery is coupled to a first source/drain of the power transistor.

In some embodiments, in the charging mode, a cathode of the charger is coupled to the cathode of the battery, and the anode of the charger is couple to a second source/drain of the power transistor.

In some embodiments, in the discharging mode, a cathode of the load is coupled to the cathode of the battery, and the anode of the load is coupled to a second source/drain of the power transistor.

In some embodiments, the chip further includes a logic control circuit, a mode detect circuit, an overcharging detect circuit, and an over-discharging detect circuit. The logic control circuit is configured to generate the first logic control signal and the second logic control signal according to a first detect signal, a second detect signal, and a third detect signal. The mode detect circuit is configured to generate the first detect signal according to the second voltage and the third voltage, so as to indicate the charging mode or the discharging mode being presented. The overcharging detect circuit is configured to generate the second detect signal according to the first voltage and the second voltage, so as to indicate whether the overcharging occurs. The over-discharging detect circuit is configured to generate the third detect signal according to the first voltage and the second voltage, so as to indicate whether the over-discharging occurs.

In some embodiments, the invert circuit includes a first transistor and a second transistor. The first transistor has a first source, a first drain, and a first gate. The second transistor has a second source, a second drain, and a second gate. The first transistor is P-type transistor, and the second transistor is N-type transistor. The first gate and the second gate are configured to receive the second logic control signal, the first source is configured to receive the first voltage, the second source is configured to receive the third voltage, the first drain is coupled to the second drain, and the first drain and the second drain are configured to generate the third logic control signal.

In some embodiments, the select circuit includes a third transistor and a fourth transistor. The third transistor has a third source, a third drain, and a third gate. The fourth transistor has a fourth source, a fourth drain, and a fourth gate. The third transistor and the fourth transistor are N-type transistor. The third gate is configured to receive the second logic control signal, the fourth gate is configured to receive the third logic control signal, the third source is coupled to the fourth source, the third drain is configured to receive the third voltage, the fourth drain is configured to receive the second voltage, and the third source and the fourth source is configured to transmit the second voltage or the third voltage to the buffer circuit.

In some embodiments, the buffer circuit includes a fifth transistor and a sixth transistor. The fifth transistor has a fifth source, a fifth drain, and a fifth gate. The sixth transistor has a sixth source, a sixth drain, and a sixth gate. The fifth transistor is P-type transistor, and the sixth transistor is N-type transistor. The fifth gate and the sixth gate are configured to receive the first logic control signal, the fifth source is configured to receive the first voltage, the sixth source is configured to receive the second voltage or the third voltage, the fifth drain is coupled to the sixth drain, and the fifth drain and the sixth drain are configured to generate the gate control signal.

In some embodiments, when the overcharging occurs, and the switch circuit generates the gate control signal having a voltage equal to the third voltage to turn off the power transistor, wherein the third voltage is lower than the second voltage.

In some embodiments, when the over-discharging occurs, and the switch circuit generates the gate control signal having a voltage equal to the second voltage to turn off the power transistor, wherein the second voltage is lower than the third voltage.

Another aspect of the present disclosure provides a battery protection device, including a power transistor and a chip. The power transistor has a control gate, first source/drain coupled to an anode of a battery, and a second source/drain coupled to an anode of a load in a discharging mode. The first source/drain is further coupled to an anode of a charger in a charging mode. The chip includes a buffer circuit and a switch circuit. The buffer circuit is configured to transmit a first voltage or one of a second voltage and a third voltage as a gate control signal to the control gate according to a first logic control signal. The switch circuit is configured to transmit the second voltage or the third voltage to the buffer circuit according to a second logic control signal. When the charger disconnects from the power transistor, the buffer circuit is further configured to continuously transmit the gate control signal to the control gate to prevent the power transistor being turned off.

In some embodiments, the switch circuit includes an invert circuit and a select circuit. The invert circuit is configured to invert the second logic control signal to generate a third logic control signal. The select circuit is configured to select the second voltage or the third voltage to transmit the same to the buffer circuit according to the second logic control signal and the third logic control signal.

In some embodiments, the invert circuit includes a first transistor and a second transistor. The first transistor has a first source, a first drain, and a first gate. The second transistor has a second source, a second drain, and a second gate. The first transistor is P-type transistor, and the second transistor is N-type transistor. The first gate and the second gate are configured to receive the second logic control signal, the first source is configured to receive the first voltage, the second source is configured to receive the third voltage, the first drain is coupled to the second drain, and the first drain and the second drain are configured to generate the third logic control signal.

In some embodiments, the select circuit includes a third transistor and a fourth transistor. The third transistor has a third source, a third drain, and a third gate. The fourth transistor has a fourth source, a fourth drain, and a fourth gate. The third transistor and the fourth transistor are N-type transistor. The third gate is configured to receive the second logic control signal, the fourth gate is configured to receive the third logic control signal, the third source is coupled to the fourth source, the third drain is configured to receive the third voltage, the fourth drain is configured to receive the second voltage, and the third source and the fourth source is configured to transmit the second voltage or the third voltage to the buffer circuit.

In some embodiments, the buffer circuit includes a fifth transistor and a sixth transistor. The fifth transistor has a fifth source, a fifth drain, and a fifth gate. The sixth transistor has a sixth source, a sixth drain, and a sixth gate. The fifth transistor is P-type transistor, and the sixth transistor is N-type transistor. The fifth gate and the sixth gate are configured to receive the first logic control signal, the fifth source is configured to receive the first voltage, the sixth source is configured to receive the second voltage or the third voltage, and the fifth drain and the sixth drain are coupled to the control gate, and configured to transmit the gate control signal.

In some embodiments, the chip further includes a logic control circuit, a mode detect circuit, an overcharging detect circuit, and an over-discharging detect circuit. The logic control circuit is configured to generate the first logic control signal and the second logic control signal according to a first detect signal, a second detect signal, and a third detect signal. The mode detect circuit is configured to generate the first detect signal according to the second voltage and the third voltage, so as to indicate the charging mode or the discharging mode being presented. The overcharging detect circuit, is configured to generate the second detect signal according to the first voltage and the second voltage, so as to indicate whether the overcharging occurs in the charging mode. The over-discharging detect circuit is configured to generate the third detect signal according to the first voltage and the second voltage, so as to indicate whether the over-discharging occurs in the discharging mode.

In some embodiments, the first voltage is provided by a cathode of a battery, the second voltage is provided by the anode of the battery, the third voltage is provided by the anode of the charger in the charging mode, and the third voltage is provided by the anode of the load in the discharging mode.

In some embodiments, the third voltage in the discharging mode is higher than the third voltage in the charging mode, the third voltage is lower than the second voltage in the charging mode, and the third voltage is higher than the second voltage in the discharging mode.

In some embodiments, when the overcharging occurs in the charging mode, the switching transmits the gate control signal having a voltage equal to the third voltage to turn off the power transistor.

In some embodiments, when the over-discharging occurs in the discharging mode, the switch circuit transmits the gate control signal having a voltage equal to the second voltage to turn off the power transistor.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

FIG. 5 is an operating chart in a charging mode according to some embodiments of the present disclosure.

FIG. 6 is an operating chart in a discharging mode according to some embodiments of the present disclosure.

DETAILED DESCRIPTION

Figure 1:
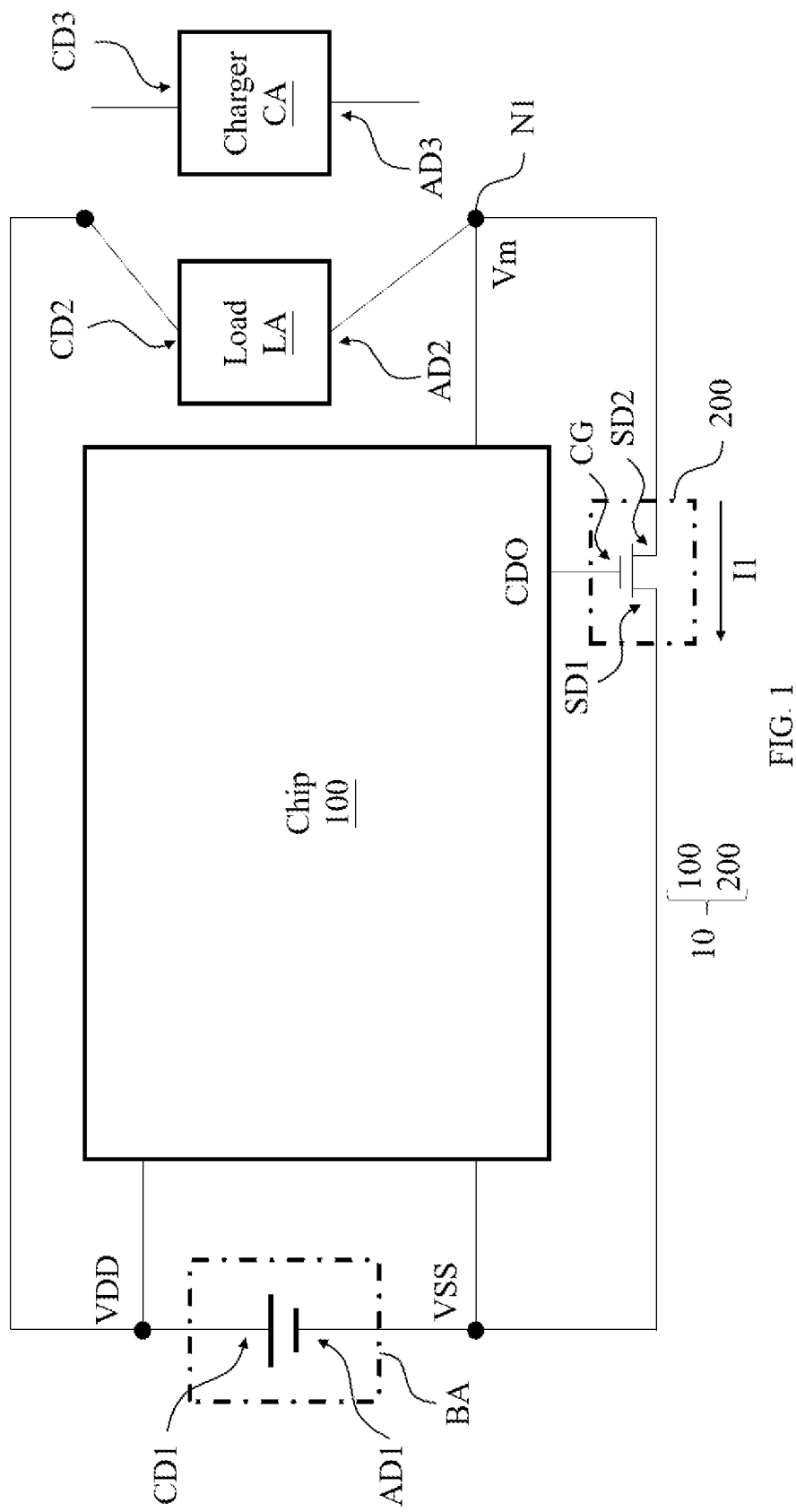
FIG. 1 is a schematic diagram of a battery protection device according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a battery protection device 10 according to some embodiments of the present disclosure. The battery protection device 10 is coupled to a battery BA and a load LA. In FIG. 1, the battery BA and the battery protection device 10 are in a discharging mode. The battery BA is configured to provide a current I1 from a cathode CD1 of the battery BA to a cathode CD2 of the load LA, and to receive the current I1 by an anode AD1 of the battery BA.

The battery protection device 10 is configured to prevent an over-discharging from occurring in the discharging mode. When the over-discharging occurs, the battery protection device 10 is configured to stop the current I1 being provided to the load LA, so as to protect the battery BA and the load LA from over-discharging.

Figure 2:
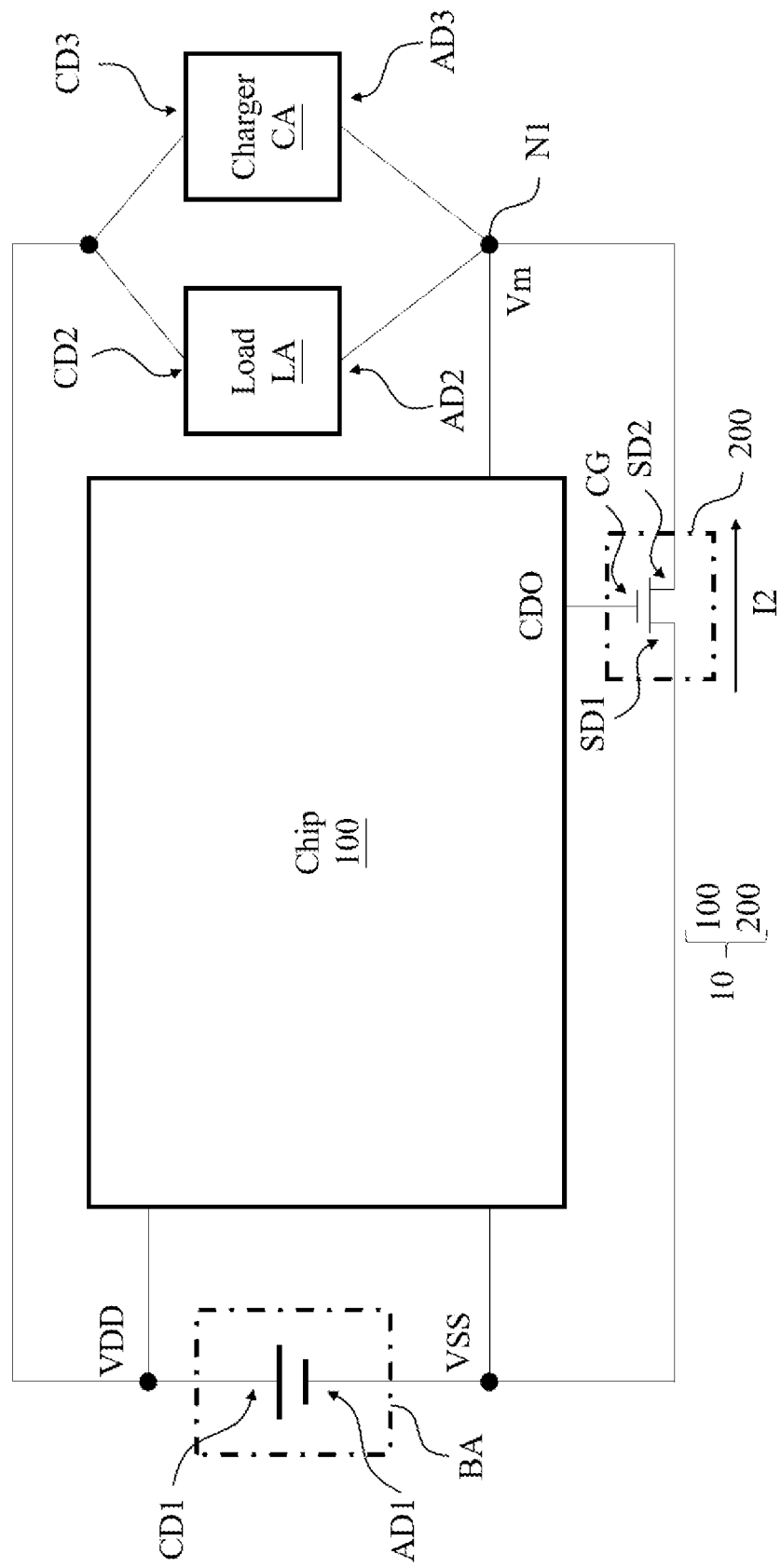
FIG. 2 is a schematic diagram of a battery protection device in a charging mode according to some embodiments of the present disclosure.

The battery protection device 10 is further configured to prevent an overcharging in a charging mode. Please refer to FIG. 2. FIG. 2 is a schematic diagram of a battery protection device 10 in the charging mode according to some embodiments of the present disclosure.

In FIG. 2, the battery BA and the battery protection device 10 are in the charging mode. A charger CA is configured to provide a current I2 from a cathode CD3 of the charger CA to the cathode CD1, and to receive the current I2 by an anode AD3 of the charger CA.

When the overcharging occurs, the battery protection device 10 is configured to stop the current I2 being provided to the battery BA, so as to protect the battery BA and the load LA from overcharging.

Please refer to FIG. 1 and FIG. 2 together. The battery protection device 10 includes a chip 100 and a power transistor 200. The chip 100 is configured to generate a gate control signal CDO according to a voltage VDD, a voltage VSS, and a voltage Vm. A control gate CG of the power transistor 200 is configured to receive the gate control signal CDO. A source/drain (S/D) SD1 of the power transistor 200 is coupled to the anode AD1, and an S/D SD2 of the power transistor 200 is coupled to a node N1. The power transistor 200 is configured to transmit the current I1 in the discharging mode and the current I2 in the discharging mode. The power transistor 200 is further configured to be turned off by the gate control signal CDO when the over-discharging and/or the overcharging occur.

The voltage VDD is provided by the cathode CD1, and the voltage VSS is provided by the anode AD1. The voltage VDD is higher than the voltage VSS, and the difference between the voltage VDD and the voltage VSS is associated with the electromotive force provided by the battery BA.

The voltage Vm is transmitted through the node N1. In the discharging mode, the anode AD2 is coupled to the node N1. In the charging mode, the anode AD2 and the anode AD3 are coupled to the N1. Alternatively stated, the voltage Vm is provided by the anode AD2 in the discharging mode, and provided by the anode AD3 in the charging mode. Therefore, the voltage Vm in the charging mode is different from the voltage Vm in the discharging mode.

Figure 3:
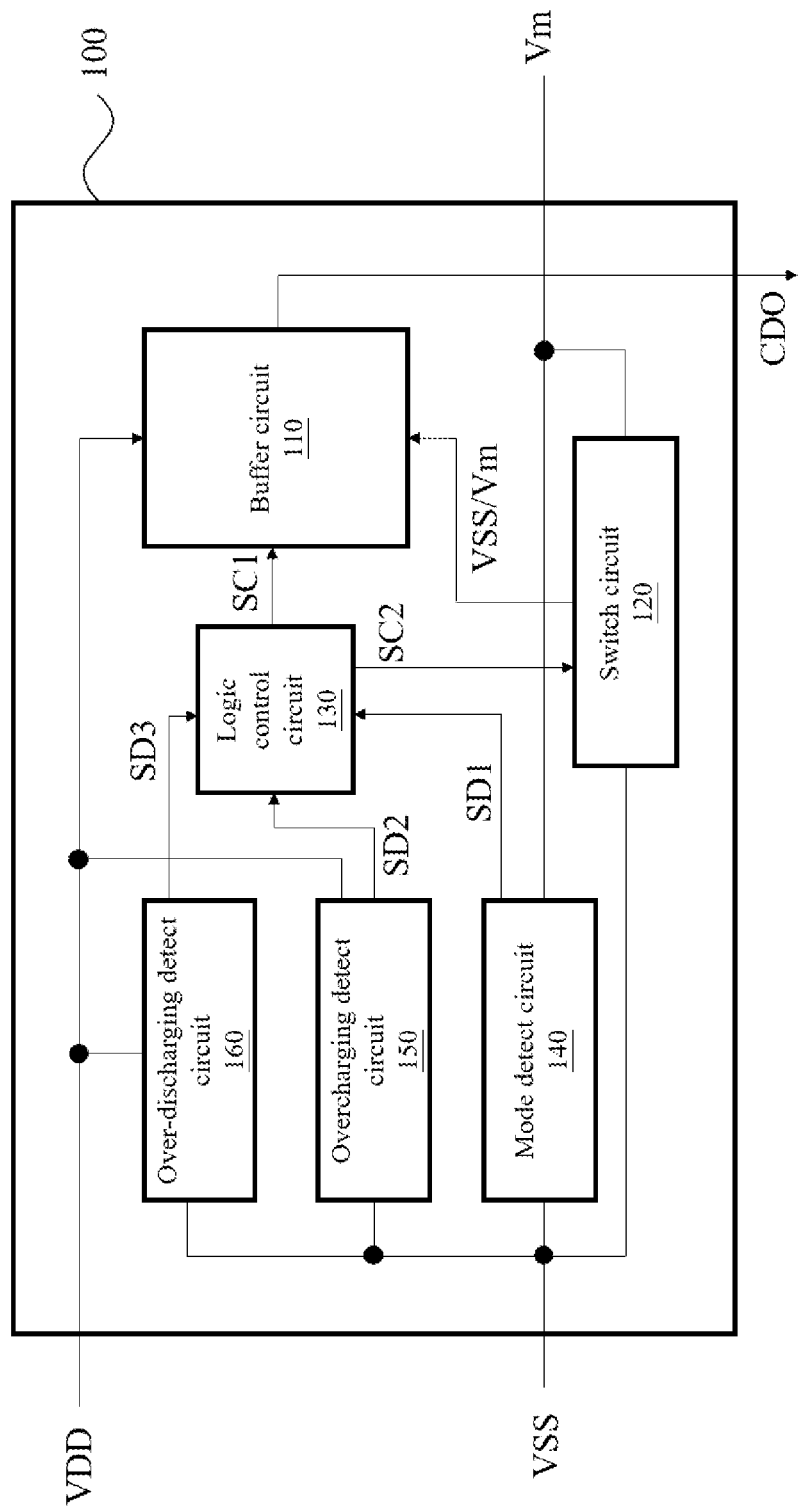
FIG. 3 is a schematic diagram of a chip according to some embodiments of the present disclosure.

Reference is made to FIG. 3. FIG. 3 is a schematic diagram of a chip 100 according to some embodiments of the present disclosure. The chip 100 includes a buffer circuit 110, a switch circuit, 120, a logic control circuit 130, a mode detect circuit 140, an overcharging detect circuit 150, and an over-discharging detect circuit 160.

The buffer circuit 110 is configured to receive a logic control signal SC1 generated by the logic control circuit 130 and the voltage VDD. The buffer circuit 110 is further configured to receive the voltage VSS or the voltage Vm transmitted from the switch circuit 120. The buffer circuit 110 generates the gate control signal CDO according to the logic control signal SC1, the voltage VDD, the voltage VSS, and the voltage Vm.

The switch circuit 120 is configured to receive the voltage VSS, the voltage Vm, and a logic control signal SC2 generated by the logic control circuit 130. The switch circuit 120 is further configured to transmit the voltage VSS or the voltage Vin to the buffer circuit 110 according to the logic control signal SC2.

The logic control circuit 130 is configured to receive a detect signal SD1 generated by the mode detect circuit 140, a detect signal SD2 generated by the overcharging detect circuit 150, and a detect signal SD3 generated by the over-discharging detect circuit 160. The logic control circuit 130 is further configured to generate the logic control signal SC1 and the logic control signal SC2 according to the detect signal SD1, the detect signal SD2, and the detect signal SD3.

The mode detect circuit 140 is configured to receive the voltage VSS and the voltage Vm, and further configured to generate the detect signal SD1 according to the voltage VSS and the voltage Vm. More specifically, the mode detect circuit 140 is configured detect whether the charging mode or the discharging mode is presented by comparing the voltage VSS to the voltage Vm. When the voltage VSS is higher than the voltage Vm, the battery BA and the battery protection device 100 are in the charging mode. When the voltage VSS is lower than the voltage Vm, the battery BA and the battery protection device 100 are in the discharging mode. The mode detect circuit 140 generates the detect signal SD1 to indicate that the charging mode or the discharging mode is presented.

The overcharging detect circuit 150 is configured to receive the voltage VDD and the voltage VSS, and further configured to generate the detect signal SD2 according to the voltage VDD and the voltage VSS. More specifically, in the charging mode, the overcharging detect circuit 150 is configured to detect whether the overcharging occurs by comparing the voltage VDD to the voltage VSS. When a difference between the voltage VDD and the voltage VSS is higher than a first predetermined threshold, the overcharging is occurs, and the overcharging detect circuit 150 generates the detect signal SD2 to indicate the overcharging occurring.

The over-discharging detect circuit 160 is configured to receive the voltage VDD and the voltage VSS, and further configured to generate the detect signal SD3 according to the voltage VDD and the voltage VSS. More specifically, in the discharging mode, the over-discharging detect circuit 160 is configured to detect whether the over-discharging occurs by comparing the voltage VDD to the voltage VSS. When a difference between the voltage VDD and the voltage VSS is lower than a second predetermined threshold, the over-discharging occurs, and the over-discharging detect circuit 160 generates the detect signal SD3 to indicate the over-discharging occurring.

Figure 4:
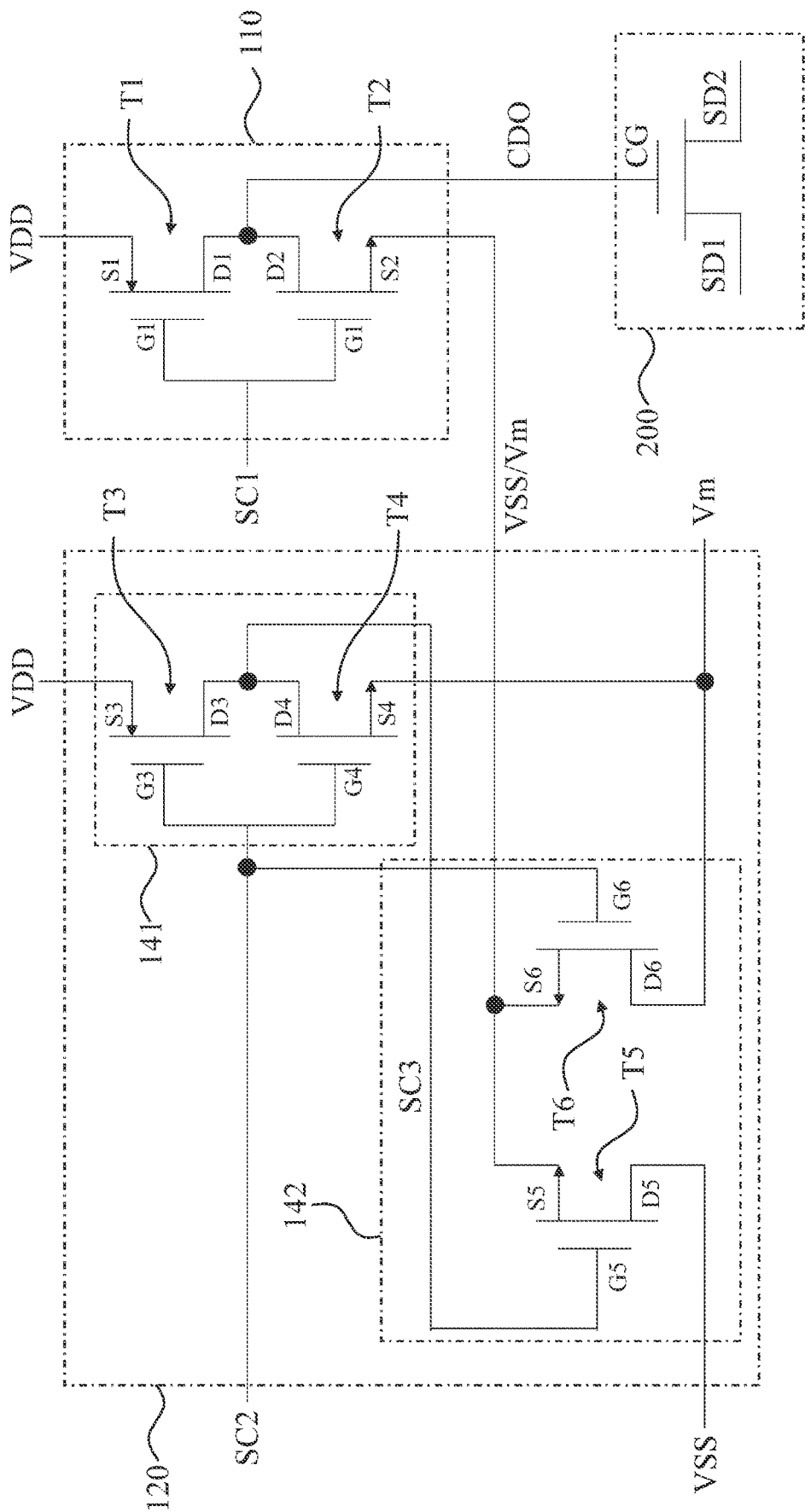
FIG. 4 is a schematic diagram of a buffer circuit, a switch circuit, and a power transistor according to some embodiments of the present disclosure.

Reference is made to FIG. 4. FIG. 4 is a schematic diagram of the buffer circuit 110, the switch circuit 120, and the power transistor 200 according to some embodiments of the present disclosure.

In some embodiments, the buffer circuit 110 is an inverter. The buffer circuit 110 inverts the logic control signal SC1 to generate the gate control signal CDO. When the logic control signal SC1 has a digital high level, the gate control signal CDO is generated to have a digital low level. The digital low level is voltage VSS or the voltage Vm depending on the operation of the switch circuit 140. In some embodiments, the digital high level is equal to the voltage VDD. In some embodiments, the digital low level is equal to the voltage VSS.

The buffer circuit 110 includes a P-type metal-oxide-semiconductor (PMOS) transistor T1 and an N-type metal-oxide-semiconductor (NMOS) transistor T2. The PMOS transistor T1 has a gate G1, a source S1, and a drain D1. The NMOS transistor T2 has a gate G2, a source S2, and a drain D2. The gate G1 and the gate G2 are configured to receive the logic control signal SC1. The source S1 is configured to receive the voltage VDD. The source S2 is coupled to the switch circuit 140. The drain D1 is coupled to the drain D2, and the drain D1 and the drain D2 are configured to generate the gate control signal CDO.

When the logic control signal SC1 has the digital high level to turn on the NMOS transistor T2 and turn off the PMOS transistor T1, the gate control signal CDO is pulled down to the voltage VSS or the voltage Vm. When the logic control signal SC1 has the digital low level to turn off the NMOS transistor T2 and turn on the PMOS transistor T1, the gate control signal CDO is pulled up to the voltage VDD.

In some embodiments, the switch circuit 120 includes an invert circuit 141 and a select circuit 142. The invert circuit 141 includes a PMOS transistor T3 and a NMOS transistor T4, and the select circuit 142 includes a NMOS transistor T5 and a NMOS transistor T6.

The PMOS transistor T3 has a gate G3, a source S3, and a drain D3. The NMOS transistor T4 has a gate G4, a source S4, and a drain D4. The gate G3 and the gate G4 are configured to receive the logic control signal SC2. The source S3 is configured to receive the voltage VDD. The source S4 is configured to receive the voltage Vm. The drain D3 is coupled to the drain D4, and the drain D3 and the drain D4 are configured to generate a logic control signal SC3.

When the logic control signal SC2 has the digital high level to turn on the NMOS transistor T4 and turn off the PMOS transistor T3, the logic control signal SC3 is pulled down to the voltage Vm. When the logic control signal SC2 has the digital low level to turn off the NMOS transistor T4 and turn on the PMOS transistor T3, the logic control signal SC3 is pulled up to the voltage VDD.

The NMOS transistor T5 has a gate G5, a source S5, and a drain D5. The NMOS transistor T6 has a gate G6, a source S6, and a drain D6. The gate G5 is configured to receive the logic control signal SC3, and the gate G6 is configured to receive the logic control signal SC2. The drain D5 is configured to receive the voltage VSS. The drain D6 is configured to receive the voltage Vm. The source S5 is coupled to the source S6, and the source S5 and the source S6 are configured to transmit the voltage VSS or the voltage Vm to the source S2 of the NMOS transistor T2 of the buffer circuit 110.

When the logic control signal SC2 has the digital high level and the logic control signal SC3 has the voltage Vm, the NMOS transistor T5 is turned off and the NMOS transistor T6 is turned on. Therefore, the voltage Vm is transmitted to the source S2 of the NMOS transistor T2 of the buffer circuit 110. When the logic control signal SC2 has the digital low level and the logic control signal SC3 has the voltage VDD, the NMOS transistor T5 is turned on and the NMOS transistor T6 is turned off. Therefore, the voltage VSS is transmitted to the source S2 of the NMOS transistor T2 of the buffer circuit 110.

Based on the battery protection device 10 shown in FIG. 1 to FIG. 4, the operations in the charging mode and the discharging mode are summarized and shown in FIG. 5 and FIG. 6.

In FIG. 5, an operating chart OC1 in the charging mode is provided according to some embodiments of the present disclosure. In FIG. 6, an operating chart OC2 in the discharging mode is provided according to some embodiments of the present disclosure.

Reference is made to FIG. 5. In the charging mode, the voltage VSS is higher than the voltage Vm. The charger CA is connected with the battery, the load LA, and the batter protection device 10. When there is no overcharging occurring, the current I2 is transmitted from the S/D SD1 to the S/D SD2 through the power transistor 200. In this condition, the logic control signal SC1 has the digital low level, and the gate control signal CDO has the voltage VDD. The S/D SD1 and the S/D SD2 have the voltage VSS and the voltage Vm, respectively. The gate control signal CDO keeps the power transistor 200 being turned on, so as to keep the current I2 being transmitted. In some embodiments, the logic control signal SC2 and the logic control signal SC3 have digital high level and the voltage Vm, respectively.

When the overcharging occurs, the logic control signal SC2 and the logic control SC3 respectively have the digital high level and the voltage Vm, so as to transmit the voltage Vm to the source S2 of the NMOS transistor T2. The logic control signal SC1 has the digital high level, and the gate control signal CDO has the voltage Vm. The power transistor 200 is turned off by the gate control signal CDO.

When the charger CA is disconnected from the battery BA in the charging mode, the battery protection device 10 is further configured to prevent the load LA from losing the power. In other words, when the charger CA is removed from the load LA and the battery BA, the battery protection device 10 is further configured to maintain the current provided to the load LA. In this condition, the voltage Vm rises to be higher than the voltage VSS due to disconnecting the charger CA. The mode detect circuit 140 detects the rising of voltage Vm, and indicates the logic control circuit 130 to generate the logic control SC1 and the logic control signal SC2 having the digital high level. Meanwhile, the gate control signal CDO is generated to have the voltage Vm. Therefore, the S/D SD2 of power transistor 200 also has the voltage Vm (which is higher than the voltage VSS now), and the current I1 is transmitted from the SD/SD2 to the S/D SD1 through the power transistor 200. The load LA is still being powered on during disconnecting the charger CA.

Reference is made to FIG. 6. In the discharging mode, the voltage VSS is lower than the voltage Vm. The charger CA is disconnected from the battery, the load LA, and the batter protection device 10. When there is no over-discharging occurring, the current I1 is transmitted from the S/D SD2 to the S/D SD1 through the power transistor 200. In this condition, the logic control signal SC1 has the digital low level, and the gate control signal CDO has the voltage VDD. The S/D SD1 and the S/D SD2 have the voltage VSS and the voltage Vm, respectively. The gate control signal CDO keeps the power transistor 200 being turned on, so as to keep the current I1 being transmitted. In some embodiments, the logic control signal SC2 and the logic control signal SC3 have digital low level and the voltage VDD, respectively.

When the over-discharging occurs, the logic control signal SC2 and the logic control SC3 respectively have the digital high low and the voltage VDD, so as to transmit the voltage VSS to the source S2 of the NMOS transistor T2. The logic control signal SC1 has the digital low level, and the gate control signal CDO has the voltage VSS. The power transistor 200 is turned off by the gate control signal CDO.

When the charger CA is re-connected to the battery BA in the discharging mode, the battery protection device 10 is further configured to prevent the load LA from losing the power. In other words, when the charger CA is re-connected to the load LA and the battery BA, the battery protection device 10 is further configured to maintain the current provided to the load LA. In this condition, the voltage Vm drops to be lower than the voltage VSS due to re-connecting the charger CA. The mode detect circuit 140 detects the dropping of voltage Vm, and indicates the logic control circuit 130 to generate the logic control SC1 and the logic control signal SC2 having the digital high level and the digital low level, respectively. Meanwhile, the gate control signal CDO is generated to have the voltage VSS. Therefore, the S/D SD2 of power transistor 200 has the voltage Vm (which is lower than the voltage VSS now), and the current I2 is transmitted from the SD/SD1 to the S/D SD2 through the power transistor 200. The load LA is still being powered on during re-connecting the charger CA.

In some conventional approaches, the battery protection chip uses diodes to connect the system low levels, in which the system low levels have different voltage levels. Due to the property of the diodes, when the voltage difference between the opposite sides of the diode is not greater than the threshold of the diode, the diode presents an open circuit. Therefore, in some situations, the system low levels cannot be switched properly, or cannot be transmitted through the diode.

Furthermore, in the other conventional approaches, when the charger is removed from the load, the load loses the power to shut down immediately. The load, such as a cell phone, may be broken due to the hard shutdown.

Compared to the above conventional approaches, the battery protection device 10 provided by the present disclosure uses a power transistor 200 without any diode to control the current I1/I2 provided to the load LA. Because the power transistor 200 can be turned on and off immediately without the threshold according to the gate control signal CDO, the battery protection device 10 can avoid the abovementioned problem in the conventional approaches.

One aspect of the present disclosure provides a chip, configured to protect a battery. The chip includes a buffer circuit and a switch circuit. The buffer circuit is configured to generate a gate control signal according to a first logic control signal, a first voltage, a second voltage, and a third voltage. The switch circuit is configured to transmit the second voltage or the third voltage to the buffer circuit. The switch circuit includes an invert circuit and a select circuit. The invert circuit is configured to invert a second logic control signal to generate a third logic control signal. The select circuit is configured to select the second voltage or the third voltage to transmit the same to the buffer circuit according to the second logic control signal and the third logic control signal. The gate control signal is configured to turn off a power transistor when an overcharging or an over-discharging occurs.

Another aspect of the present disclosure provides a battery protection device, including a power transistor and a chip. The power transistor has a control gate, first source/drain coupled to an anode of a battery, and a second source/drain coupled to an anode of a load in a discharging mode. The first source/drain is further coupled to an anode of a charger in a charging mode. The chip includes a buffer circuit and a switch circuit. The buffer circuit is configured to transmit a first voltage or one of a second voltage and a third voltage as a gate control signal to the control gate according to a first logic control signal. The switch circuit is configured to transmit the second voltage or the third voltage to the buffer circuit according to a second logic control signal. When the charger disconnects from the power transistor, the buffer circuit is further configured to continuously transmit the gate control signal to the control gate to prevent the power transistor being turned off.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A chip, configured to protect a battery, comprising:
   a buffer circuit, configured to generate a gate control signal according to a first logic control signal, a first voltage, a second voltage, and a third voltage; and
   a switch circuit, configured to transmit the second voltage or the third voltage to the buffer circuit, wherein the switch circuit comprises:
   an invert circuit, configured to invert a second logic control signal to generate a third logic control signal, wherein when the second logic control signal has a digit low level, the invert circuit transmits the first voltage to be the third logic control signal, and when the second logic control signal has a digit high level, the invert circuit transmits the third voltage to be the third logic control signal, wherein the third voltage is different from the second voltage; and a select circuit, configured to select the second voltage or the third voltage to transmit the same to the buffer circuit according to the second logic control signal and the third logic control signal, comprising:

a third transistor, having a third source, a third drain, and a third gate;

a fourth transistor, having a fourth source, a fourth drain, and a fourth gate, wherein the third transistor and the fourth transistor are N-type transistors, and wherein the third gate is configured to receive the second logic control signal, the fourth gate is configured to receive the third logic control signal, the third source is coupled to the fourth source, the third drain is configured to receive the third voltage, the fourth drain is configured to receive the second voltage, and the third source and the fourth source is configured to transmit the second voltage or the third voltage to the buffer circuit, wherein the gate control signal is configured to turn off a power transistor when an overcharging or an over-discharging occurs.

2. The chip of claim 1, wherein the first voltage is provided by a cathode of the battery, the second voltage is provided by an anode of the battery, the third voltage is provided by an anode of a charger in a charging mode, and the third voltage is provided by an anode of a load in a discharging mode, wherein the anode of the battery is coupled to a first source/drain of the power transistor.

3. The chip of claim 2, wherein in the charging mode, a cathode of the charger is coupled to the cathode of the battery, and the anode of the charger is coupled to a second source/drain of the power transistor.

4. The chip of claim 2, wherein in the discharging mode, a cathode of the load is coupled to the cathode of the battery, and the anode of the load is coupled to a second source/drain of the power transistor.

5. The chip of claim 2, further comprising:

a logic control circuit, configured to generate the first logic control signal and the second logic control signal according to a first detect signal, a second detect signal, and a third detect signal;

a mode detect circuit, configured to generate the first detect signal according to the second voltage and the third voltage, so as to indicate the charging mode or the discharging mode being presented;

an overcharging detect circuit, configured to generate the second detect signal according to the first voltage and the second voltage, so as to indicate whether the overcharging occurs; and an over-discharging detect circuit, configured to generate the third detect signal according to the first voltage and the second voltage, so as to indicate whether the over-discharging occurs.

6. The chip of claim 1, wherein the invert circuit comprises:

a first transistor, having a first source, a first drain, and a first gate; and a second transistor, having a second source, a second drain, and a second gate, wherein the first transistor is a P-type transistor, and the second transistor is an N-type transistor, and wherein the first gate and the second gate are configured to receive the second logic control signal, the first source is configured to receive the first voltage, the second source is configured to receive the third voltage, the first drain is coupled to the second drain, and the first drain and the second drain are configured to generate the third logic control signal.

7. The chip of claim 1, wherein the buffer circuit comprises:

a fifth transistor, having a fifth source, a fifth drain, and a fifth gate; and a sixth transistor, having a sixth source, a sixth drain, and a sixth gate, wherein the fifth transistor is a P-type transistor, and the sixth transistor is an N-type transistor, and wherein the fifth gate and the sixth gate are configured to receive the first logic control signal, the fifth source is configured to receive the first voltage, the sixth source is configured to receive the second voltage or the third voltage, the fifth drain is coupled to the sixth drain, and the fifth drain and the sixth drain are configured to generate the gate control signal.

8. The chip of claim 1, wherein when the overcharging occurs, the switch circuit generates the gate control signal having a voltage equal to the third voltage to turn off the power transistor, wherein the third voltage is lower than the second voltage.

9. The battery protection chip of claim 1, wherein when the over-discharging occurs, the switch circuit generates the gate control signal having a voltage equal to the second voltage to turn off the power transistor, wherein the second voltage is lower than the third voltage.

10. A battery protection device, comprising:

a power transistor, having a control gate, a first source/drain coupled to an anode of a battery, and a second source/drain coupled to an anode of a load in a discharging mode, wherein the first source/drain is further coupled to an anode of a charger in a charging mode; and a chip, comprising:

a buffer circuit, configured to transmit a first voltage or one of a second voltage and a third voltage as a gate control signal to the control gate according to a first logic control signal; and a switch circuit, configured to transmit the second voltage or the third voltage to the buffer circuit according to a second logic control signal, wherein when the charger disconnects from the power transistor, the buffer circuit is further configured to continuously transmit the gate control signal to the control gate to prevent the power transistor being turned off, wherein the switch circuit comprises:

an invert circuit, configured to invert the second logic control signal to generate a third logic control signal, wherein when the second logic control signal has a digit low level, the invert circuit transmits the first voltage to be the third logic control signal, and when the second logic control signal has a digit high level, the invert circuit transmits the third voltage to be the third logic control signal, wherein the third voltage is different from the second voltage; and a select circuit, configured to select the second voltage or the third voltage to transmit the same to the buffer circuit according to the second logic control signal and the third logic control signal, comprising:

a third transistor, having a third source, a third drain, and a third gate;

a fourth transistor, having a fourth source, a fourth drain, and a fourth gate, wherein the third transistor and the fourth transistor are N-type transistors, and wherein the third gate is configured to receive the second logic control signal, the fourth gate is configured to receive the third logic control signal, the third source is coupled to the fourth source, the third drain is configured to receive the third voltage, the fourth drain is configured to receive the second voltage, and the third source and the fourth source is configured to transmit the second voltage or the third voltage to the buffer circuit.

11. The battery protection device of claim 10, wherein the invert circuit comprises:

a first transistor, having a first source, a first drain, and a first gate; and a second transistor, having a second source, a second drain, and a second gate, wherein the first transistor is a P-type transistor, and the second transistor is an N-type transistor, and wherein the first gate and the second gate are configured to receive the second logic control signal, the first source is configured to receive the first voltage, the second source is configured to receive the third voltage, the first drain is coupled to the second drain, and the first drain and the second drain are configured to generate the third logic control signal.

12. The battery protection device of claim 10, wherein the buffer circuit comprises:

a fifth transistor, having a fifth source, a fifth drain, and a fifth gate; and a sixth transistor, having a sixth source, a sixth drain, and a sixth gate, wherein the fifth transistor is a P-type transistor, and the sixth transistor is an N-type transistor, and wherein the fifth gate and the sixth gate are configured to receive the first logic control signal, the fifth source is configured to receive the first voltage, the sixth source is configured to receive the second voltage or the third voltage, and the fifth drain and the sixth drain are coupled to the control gate, and configured to transmit the gate control signal.

13. The battery protection device of claim 10, wherein the chip further comprises:

a logic control circuit, configured to generate the first logic control signal and the second logic control signal according to a first detect signal, a second detect signal, and a third detect signal;

a mode detect circuit, configured to generate the first detect signal according to the second voltage and the third voltage, so as to indicate the charging mode or the discharging mode being presented;

an overcharging detect circuit, configured to generate the second detect signal according to the first voltage and the second voltage, so as to indicate whether the overcharging occurs in the charging mode; and an over-discharging detect circuit, configured to generate the third detect signal according to the first voltage and the second voltage, so as to indicate whether the over-discharging occurs in the discharging mode.

14. The battery protection device of claim 10, wherein the first voltage is provided by a cathode of the battery, the second voltage is provided by the anode of the battery, the third voltage is provided by the anode of the charger in the charging mode, and the third voltage is provided by the anode of the load in the discharging mode.

15. The battery protection device of claim 14, wherein the third voltage in the discharging mode is higher than the third voltage in the charging mode, the third voltage is lower than the second voltage in the charging mode, and the third voltage is higher than the second voltage in the discharging mode.

16. The battery protection device of claim 14, wherein when the overcharging occurs in the charging mode, the switch circuit transmits the gate control signal having a voltage equal to the third voltage to turn off the power transistor.

17. The battery protection device of claim 14, wherein when the over-discharging occurs in the discharging mode, the switch circuit transmits the gate control signal having a voltage equal to the second voltage to turn off the power transistor.

* * * * *